United States Patent
Long et al.

(10) Patent No.: US 10,461,690 B2
(45) Date of Patent: Oct. 29, 2019

(54) DEFECT INSPECTION METHOD AND SYSTEM FOR SOLAR CELL

(71) Applicant: Industrial Technology Research Institute, Hsinchu (TW)

(72) Inventors: Yean-San Long, Hsinchu (TW); En-Yun Wang, New Taipei (TW); Ren-Chin Shr, Hsinchu (TW); Yu-Ting Yen, Taipei (TW); Hsiang-Ying Cheng, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 196 days.

(21) Appl. No.: 15/830,010

(22) Filed: Dec. 4, 2017

(65) Prior Publication Data

US 2019/0173423 A1   Jun. 6, 2019

(51) Int. Cl.
| | |
|---|---|
| *G01R 31/26* | (2014.01) |
| *H02S 50/10* | (2014.01) |
| *G06F 3/14* | (2006.01) |
| *H01L 31/18* | (2006.01) |

(52) U.S. Cl.
CPC ............... *H02S 50/10* (2014.12); *G06F 3/14* (2013.01); *H01L 31/18* (2013.01)

(58) Field of Classification Search
CPC . G01R 31/2603; G01R 31/2605; H02S 50/00; H02S 50/10; H02S 50/15; H01L 31/18; G01N 21/95
See application file for complete search history.

(56) References Cited

U.S. PATENT DOCUMENTS

| 4,528,503 A | 7/1985 | Cole |
| 5,945,839 A | 8/1999 | Hyvarinen |
| 8,224,598 B2 | 7/2012 | Wu et al. |

(Continued)

FOREIGN PATENT DOCUMENTS

| CN | 102565187 | 7/2012 |
| CN | 104641551 | 5/2015 |

(Continued)

OTHER PUBLICATIONS

Office Action of Taiwan Counterpart Application, dated Oct. 2, 2018, pp. 1-8.

(Continued)

*Primary Examiner* — Minh N Tang
(74) *Attorney, Agent, or Firm* — JCIPRNET

(57) ABSTRACT

A defect inspection method and a defect inspection system for a solar cell are proposed, where the method includes the following steps. Output voltages and output currents of the solar cell are measured by a measuring device. A stepwise current-voltage curve (stepwise IV curve) and a fitted current-voltage curve (fitted IV curve) are generated by a processing device according to the output voltages and the output currents, and whether a first error of the fitted IV curve is less than a first error tolerance is determined by the processing device. When the first error is not less than the first error tolerance, whether there exists at least one surge in steps of the stepwise IV curve is determined by the processing device so as to determine whether the solar cell has a defect. Next, a determined result of the processing device is outputted by the output device.

20 Claims, 5 Drawing Sheets

(56) References Cited

U.S. PATENT DOCUMENTS

| | | | |
|---|---|---|---|
| 8,744,791 B1* | 6/2014 | Kraft | H02S 50/00 |
| | | | 702/65 |
| 2009/0000659 A1 | 1/2009 | Hasegawa | |
| 2013/0175862 A1* | 7/2013 | Kelly | H02J 1/14 |
| | | | 307/24 |
| 2015/0039270 A1* | 2/2015 | Long | H02S 50/00 |
| | | | 702/183 |

FOREIGN PATENT DOCUMENTS

| | | |
|---|---|---|
| CN | 105162415 | 4/2017 |
| TW | 201303320 | 1/2013 |
| TW | 201505357 | 2/2015 |
| TW | I486601 | 6/2015 |

OTHER PUBLICATIONS

Marc Köntges et al., "Performance and Reliability of Photovoltaic Systems Subtask 3.2: Review of Failures of Photovoltaic Modules," IEA PVPS Task 13 External final report IEA-PVPS, Mar. 2014, pp. 1-132.

* cited by examiner

DEFECT INSPECTION METHOD AND SYSTEM FOR SOLAR CELL

TECHNICAL FIELD

The disclosure relates to a defect inspection technique for a solar cell.

BACKGROUND

In general, electricity of a photovoltaic (PV) module is produced through a process of generating photocurrents by each solar cell unit, enhancing voltages by module concatenation, and converting the enhanced voltages to mains electricity. During the process, a condition such as breakdown, internal connection failure, stain, or obstruction occurring in any solar cell unit, or a destructive defect such as crack or air bubble occurring during module production, packaging, or delivering would cause current mismatch between solar cell units and induce a hot spot effect due to overheat. As long as any hot spot is formed on a solar cell unit, there is not only no benefit on overall electricity production, but the electricity produced by other solar cell units would also be consumed. The entire module would thereby undergo thermal breakdown or even cause fire hazards.

A hot spot endurance test on a PV module is conventionally based on defect recognition on electroluminescence (EL) images or thermal images. The recognition process may be affected due to sensor pixel size and weather limitations, and the inspection process may normally take several days to complete.

SUMMARY OF THE DISCLOSURE

Accordingly, a defect inspection method and system for a solar cell are proposed in the disclosure, where a quick inspection on the quality of the solar cell would be performed so as to identify any defect ahead of time for early exchange that would ensure the usage safety as well as minimize fire hazards at power stations.

According to one of the exemplary embodiments, the method is applicable to a defect inspection system having a measuring output device, a processing device, and an output device, and the method includes the following steps. Output voltages and output currents of the solar cell are measured by the measuring device. A stepwise current-voltage curve (stepwise IV curve) and a fitted current-voltage curve (fitted IV curve) are generated by a processing device according to the output voltages and the output currents, and whether a first error between the stepwise IV curve and the fitted IV curve is less than a first error tolerance is determined by the processing device, where the stepwise IV curve includes multiple steps, and the fitted IV curve corresponds to an ideal IV curve when the solar cell has no defect. When the first error is not less than the first error tolerance, whether there exists any surge in each of the steps of the stepwise IV curve is determined by the processing device so as to determine whether the solar cell has a defect. Next, a determined result of the processing device is outputted by the output device.

According to one of the exemplary embodiments, the system includes a measuring device, a processing device, and an output device, where the processing device is connected to the measuring device and the output device. The measuring device is configured to measure output voltages and output currents of the solar cell. The processing device is configured to generate a stepwise IV curve and a fitted IV curve according to the output voltages and the output currents and determine whether a first error of the fitted IV curve is less than a first error tolerance, where the stepwise IV curve includes multiple steps, and where the fitted IV curve corresponds to an ideal current-voltage curve when the solar cell does not have any defect. When the first error is not less than the first error tolerance, the processing device is configured to determine whether there exists any surge in each of the steps of the stepwise IV curve so as to accordingly determine whether the solar cell has a defect. The output device is configured to output the determined result of the processing device.

In order to make the aforementioned features and advantages of the present invention comprehensible, preferred embodiments accompanied with figures are described in detail below.

DESCRIPTION OF THE EMBODIMENTS

Figure 1:
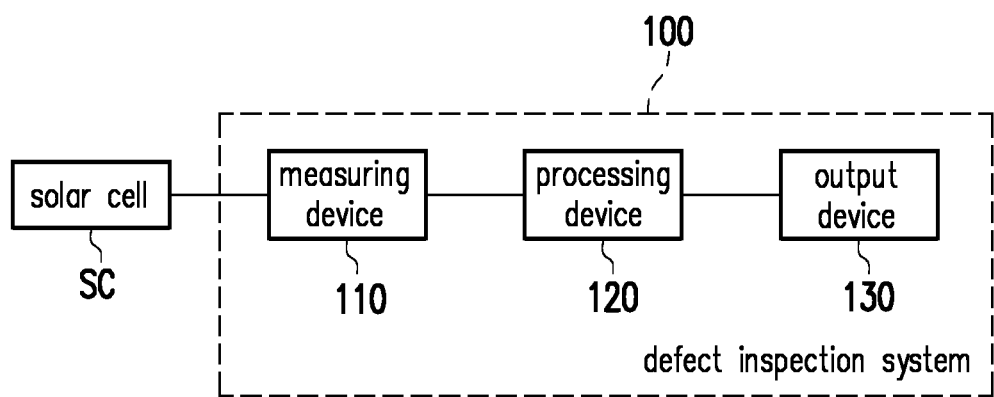
FIG. 1 illustrates a block diagram of a defect inspection system for a solar cell in accordance with one of the exemplary embodiments of the disclosure.

Reference will now be made in detail to the present preferred embodiments of the disclosure, examples of which are illustrated in the accompanying drawings. Wherever possible, the same reference numbers are used in the drawings and the description to refer to the same or like parts. Indeed, various embodiments of the invention may be embodied in many different forms and should not be construed as limited to the embodiments set forth herein; rather, these embodiments are provided so that this invention will satisfy applicable legal requirements.

FIG. 1 illustrates a block diagram of a defect inspection system for a solar cell in accordance with one of the exemplary embodiments of the disclosure. All components of the defect inspection system and their configurations are first introduced in FIG. 1. The functionalities of the components are disclosed in more detail in conjunction with FIG. 2.

Referring to FIG. 1, a defect inspection system 100 for a solar cell SC in the present exemplary embodiment would at least include a measuring device 110, a processing device 120, and an output device 130.

The measuring device 100 would be configured to perform electrical inspection on the solar cell SC to measure output voltages and output currents of the solar cell SC. The measuring device 110 may be a source measure unit or a source meter that would perform IV scanning on the solar cell SC as well as measure and transmit output voltages and output currents of the solar cell SC to the processing device 120.

The processing device 120 would be configured to analyze the measurements received from the measuring device 110 to determine whether there exists any defect in the solar cell SC. The processing device 120 may be a computing device with computing capability, such as an industrial computer, a workstation, a personal computer, a laptop computer, or a tabular computer. It would be understood by those skilled in the art that the processing device 120 would include a processor and a data storage device. The processor may be a north bridge, a south bridge, a field programmable gate array (FPGA), a programmable logic device (PLD), application specific integrated circuits (ASIC), other similar devices, a combination or integrated circuits of the aforementioned devices. The processor may also be a central processing unit (CPU), an application processor (AP), a programmable general purpose or special purpose microprocessor, a digital signal processor (DSP), a graphics processing unit (GPU), other similar devices, a combination or integrated circuits of the aforementioned devices. The data storage device would include a memory in various forms of non-transitory, volatile, and non-volatile memories which would store buffered or permanent data as well as compiled programming codes used to execute functions of the processing device 120.

The output device 130 may be a display, a speech output device, a light alert device that would output an inspection result of the solar cell SC performed by the processing device 120. In the present exemplary embodiment, the output device 130 may output the inspection result only when the processing device 120 determines that the solar cell SC has a defect, and yet the disclosure is not limited in this regard. Moreover, the output device 130 may be a communication interface supported by any wireless communication standard that would be able to send an inspection result to other electronic devices so as to inform the user or maintenance staffs.

Figure 2:
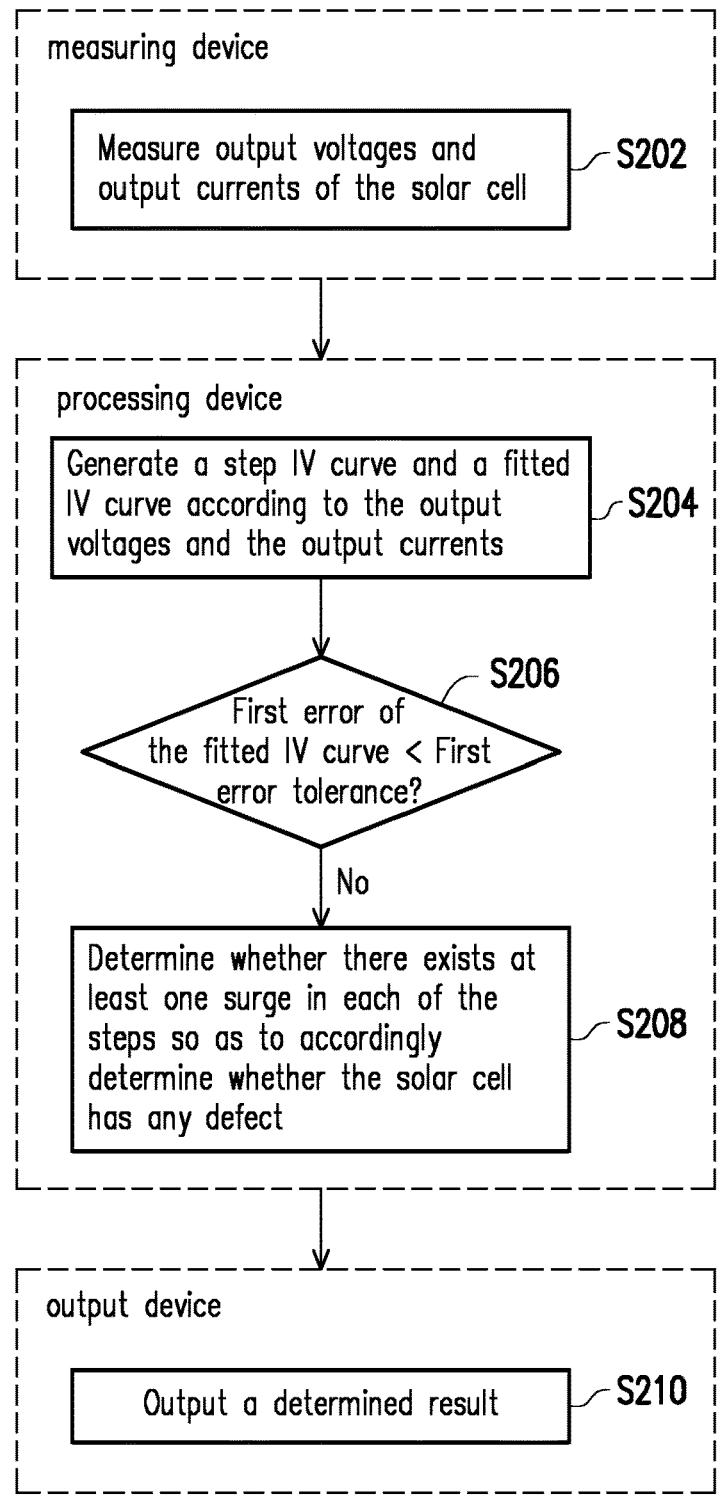
FIG. 2 illustrates a defect inspection method for a solar cell in accordance with one of the exemplary embodiments of the disclosure.

FIG. 2 illustrates a defect inspection method for a solar cell in accordance with one of the exemplary embodiments of the disclosure. The steps of FIG. 2 could be implemented by the defect inspection system 100 as illustrated in FIG. 1. It should be noted that, the flow presented in FIG. 2 may be performed individually on each cell unit of the solar cell SC. However, the flow presented in FIG. 2 may be performed by all cell units as a whole in other exemplary embodiments. The disclosure is not limited in this regard.

Referring both FIG. 1 and FIG. 2, the measuring device 110 would measure output voltages and output currents of the solar cell SC (Step S202), and the processing device 120 would generate a stepwise IV curve and a fitted IV curve according to the output voltages and the output currents (Step S204). Herein, the measuring device 110 may perform inspection on the solar cell SC in a current-voltage stepwise scanning mode, where the stepwise IV curve may be a curve formed by the actual measurements of the output voltages and the output currents. The fitted IV curve may be obtained by performing curve fitting on the output voltages and the output currents by using a polynomial fitted curve equation (e.g. $I=f(V)=a_0+a_aV+a_2V^2+ \ldots +a_nV^n$). The processing device 120 may obtain a representative IV point from each of the steps and perform curve fitting on the representative IV points of all the steps. Herein, first few data in each of the steps affected by a capacitance effect during charge and discharge of the solar cell SC would be discarded. A point in each of the steps corresponding to an average of remaining data would be the representative IV point.

Next, the processing device 120 would determine whether a first error of the fitted IV curve is less than a first error tolerance (Step S206) for an initial inspection on the solar cell SC. In other word, the processing device 120 would determine whether an error between the actual measurements and the fitted IV curve is less than the first error tolerance. The first error tolerance may be, for example, 1%. When the first error is less than the first error tolerance, it means that the solar cell SC substantially has no defect at this point, and the processing device 120 would end the inspection process.

On the other hand, when the first error is not less than the first error tolerance, the processing device 120 would determine whether there exists at least one surge in each of the steps so as to accordingly determine whether the solar cell SC has any defect (Step S208). The processing device 120 may determine whether there exists any surge in each of the steps by using a peak function, and further determine whether the solar cell SC has any hot spot, poor wire connection, noise, stain, or other defects. More details would be provided later on.

Finally, the output device 130 would output the determined result of the processing device 120 (Step S210). Herein, when the processing device 130 determines that a hot spot exists in the solar cell SC, the output device 130 may trigger a prompt such as alert light or a voice signal, or may inform other electronic devices through a message or an e-mail. Moreover, the output device 130 may further identify a particular unit cell of the solar cell SC that exists hot spots in the determined result.

Figure 3:
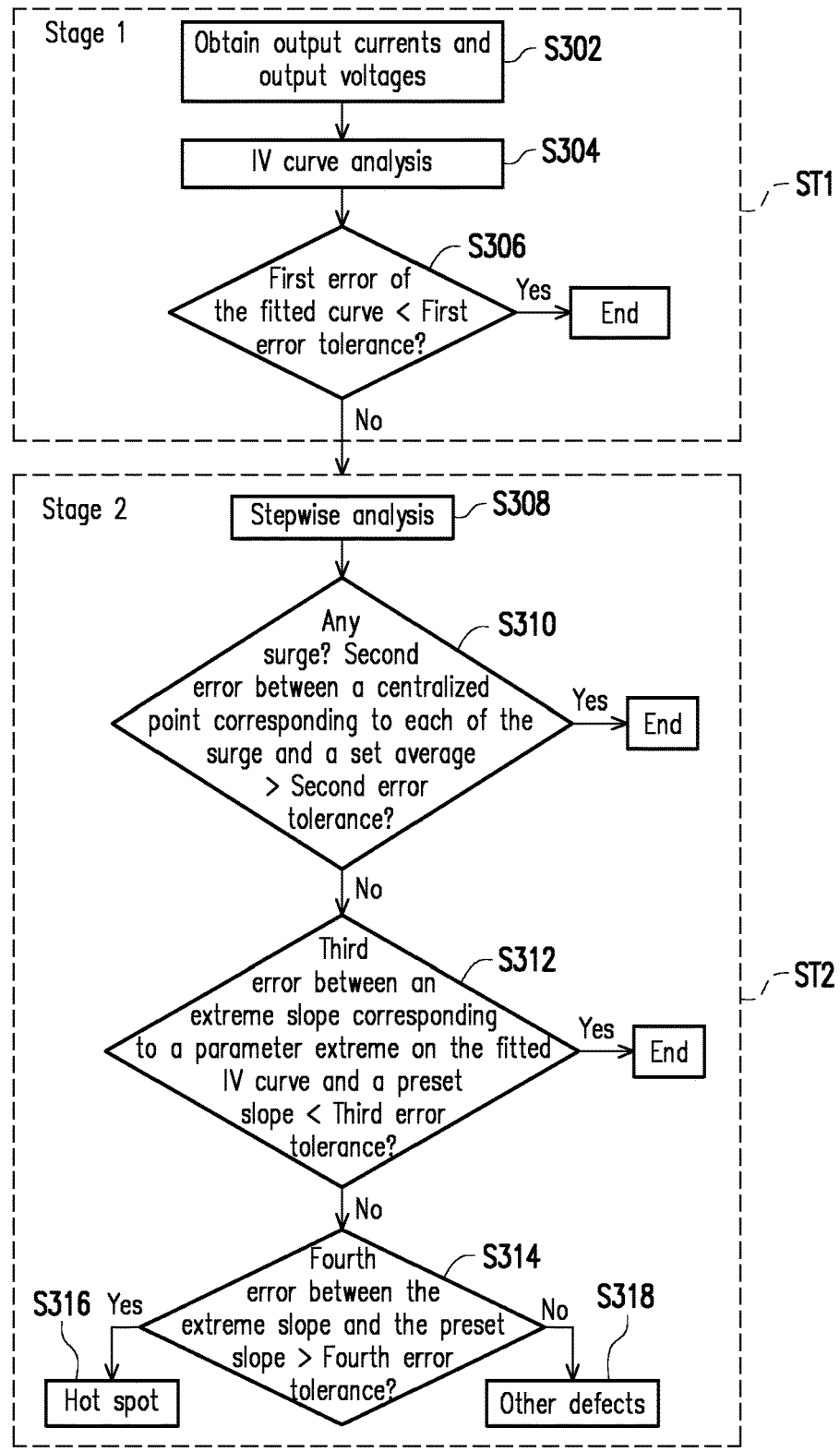
FIG. 3 illustrates a defect inspection method for a solar cell in accordance with one of the exemplary embodiments of the disclosure.

FIG. 3 illustrates a defect inspection method for a solar cell in accordance with another one of the exemplary embodiments of the disclosure. The steps of FIG. 3 could also be implemented by the defect inspection system 100 as illustrated in FIG. 1.

In a first stage ST1, the processing device 120 would perform initial quick inspection on the solar cell SC by obtaining a measurement data file associated with the solar cell SC from the measuring device 110 to obtain output currents and output voltages (Step S302) and performing IV curve analysis (Step S304) to generate a step IV curve and a fitted IV curve. Next, the processing device 120 would first determine whether a first error of the fitted IV curve is less than a first error tolerance (Step S306). The details of Steps S302-S306 may refer to related descriptions of Steps S202-S206 and would not be repeated for brevity. When the first error is less than the first error tolerance, it means that the solar cell SC substantially has no defect at this point, and the processing device 120 would end the inspection process of the solar cell SC.

When the first error is not less than the first error tolerance, the processing device 120 would enter a second stage ST2 to further determine whether there exists any hotspot, poor wire connection, stain, or other defects in the solar cell SC. First, the processing device 120 would perform step analysis on the step IV curve (Step S308) to determine whether there exists any surge in each step and whether a second error between a centralized point corresponding to each of the surges and a set average is greater than a second error tolerance (Step S310). The processing device 120 may determine whether there exists any surge in each of the steps by using a peak function such as a Gaussian function, a Lorentzian function, and so forth. In general, the Gaussian function describes a wide and flat peak profile, and the Lorentzian function describes a narrow and sharp peak profile. In the present exemplary embodiment, the processing device 120 may determine whether there exists any surge by using a linear combination of the Gaussian function and the Lorentzian function with equal weights.

Figure 4:
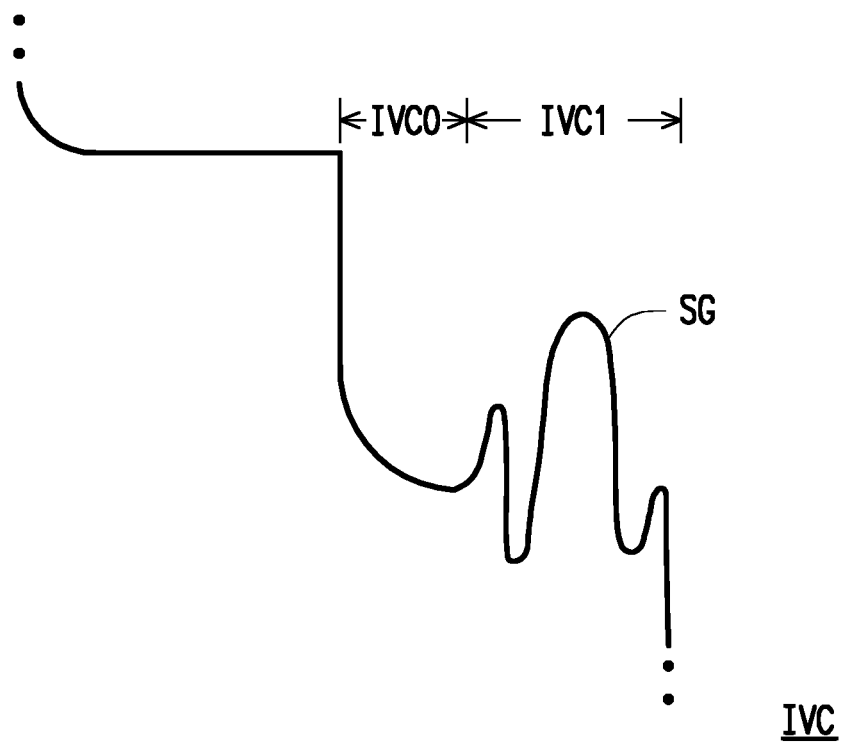
FIG. 4 illustrates a schematic diagram of a step having a surge in accordance with an exemplary embodiment of the disclosure.

It should be noted that, similar to the previous exemplary embodiments, while the processing device 120 is processing each of the steps, the capacitance effect would also be considered. As an example, FIG. 4 illustrates a schematic diagram of a step having a surge in accordance with an exemplary embodiment of the disclosure. As for a step S of a step IV curve IVC, the processor 120 would only perform determination and computation based on data in an interval IVC1 and disregard an interval IVC0 caused by capacitance effect, where a curve SG is a surge in the step S.

Next, the processing device 120 would obtain the centralized point corresponding to the surges in each of the steps. If there is only one surge in a single step, the centralized point may be, for example, a peak value of such surge. If there are multiple peak values in a single step, the centralized point may be, for example, a midpoint or an average point of the peak values. Next, the processing device 120 would obtain and set the centralized points in all the steps as a set, and then calculate and set an average of all the centralized points as the aforementioned set average. When no surge exists in all the steps or when the second error corresponding to all the existing surges is less than the second error tolerance, it means that the solar cell SC may have noise or poor wire connection or even wire disconnection but would not cause any safety issue at this point, and thus the processing device 120 would end the inspection process of the solar cell SC.

When the second error is not less than the second error tolerance, the processing device 120 would further determine whether a third error between an extreme slope corresponding to a parameter extreme on the step IV curve and an ideal slope is less than a third error tolerance (Step S312), where the third error tolerance may be 1%. The parameter extreme may be one or a combination of open circuit voltage ($V_{OC}$), short circuit current ($U_{SC}$), and maximum power ($P_{max}$). Assume that the parameter extreme is maximum power which would normally be a turning point on the IV curve. When a hot spot is formed on a component, irregular or discontinuous intervals would reflect on shunt resistor Rsh and series resistance Rs (i.e. a reciprocal of a slope of the IV curve) since inner electrons are obstructed.

Figure 5:
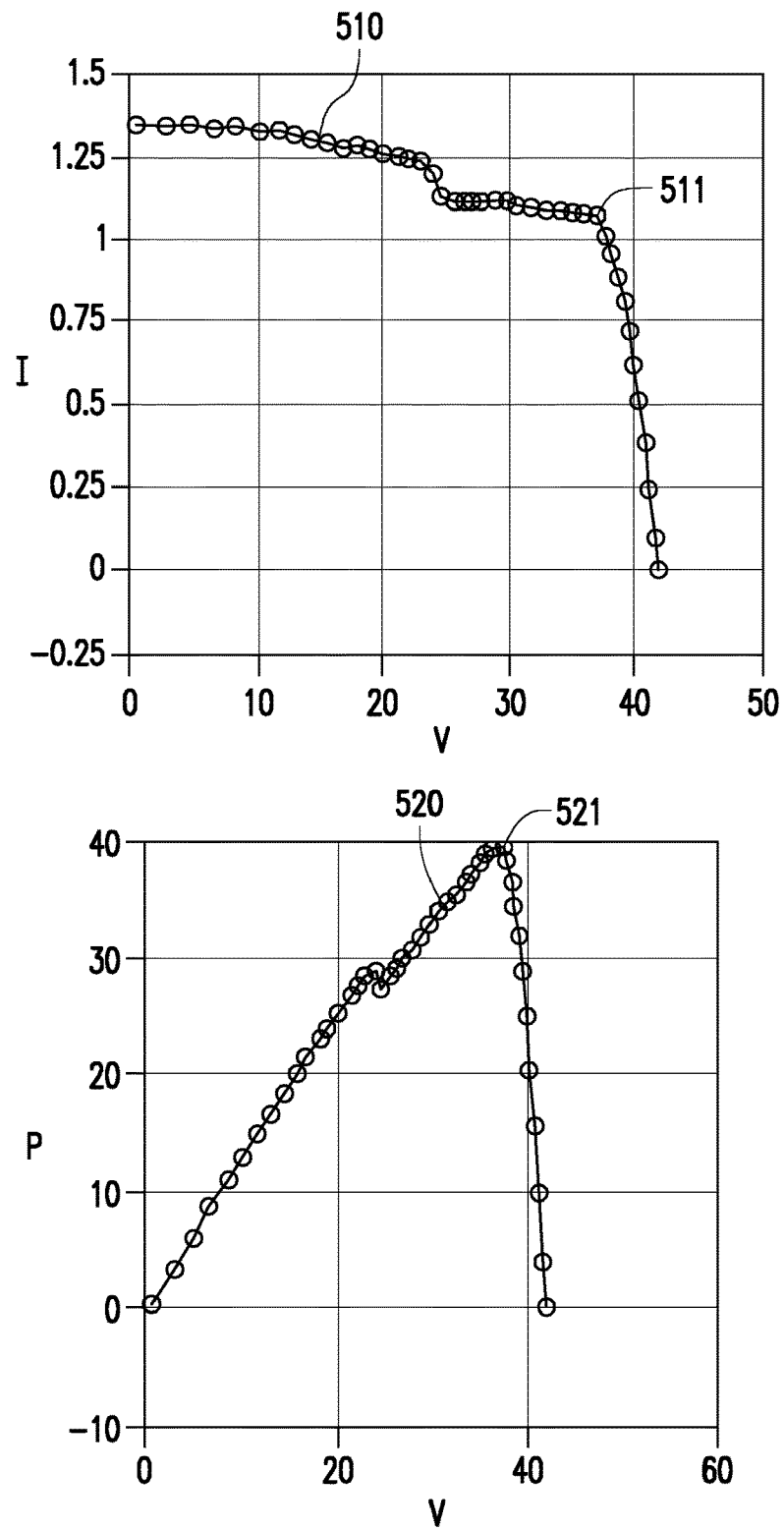
FIG. 5 illustrates schematic diagrams of an IV curve and a power-voltage (PV) curve in accordance with an exemplary embodiment of the disclosure.

As an example, FIG. 5 illustrates schematic diagrams of an IV curve and a PV curve in accordance with an exemplary embodiment of the disclosure. Assume that an IV curve 510 is plotted according to the representative IV values as described in Step S204. The multiplication of each current and voltage (i.e. power) against the respective voltage may be plotted as a PV curve 520, where a point 511 on the IV curve 510 would correspond to a point 521 with maximum power on the PV curve 520.

The extreme slope in Step S312 may be a slope of a point with maximum power on the step IV curve with respect to a previous reference point on the step IV curve (e.g. any point in a particular interval). Next, the processing device 120 would determine an idea slope corresponding to the parameter extreme on the fitted IV curve, such as a slope of a point with maximum power on the fitted IV curve with respect to a previous reference point on the fitted IV curve (e.g. a starting point or any point in a particular interval).

When the processing device 120 determines that the third error between the extreme slope and the ideal slope is less than the third error tolerance, it means that the solar cell SC may have poor wire connection or wire disconnection but would not cause any safety issue at this point, and thus the processing device 120 would end the inspection process of the solar cell SC.

When the third error is not less than the third error tolerance, the processing device 120 would further determine whether a fourth error between the extreme slope and the ideal slope is greater than a fourth error tolerance (Step S314), where the fourth error tolerance may be 2%. When the fourth error is greater than the fourth error tolerance, it means that there may exist hot spots in the solar cell SC (Step S316), and the output device 130 would output alert light or a voice signal, or may send a message or an e-mail to other electronic devices. When the fourth error is not greater than the fourth error tolerance, it means that other defects may exist in the solar cell SC (Step S318), and the output device 130 may optionally output different alert light, a different voice signal, or may send a message or an e-mail to other electronic devices.

In view of the aforementioned descriptions, a defect inspection method and system for a solar cell are proposed in the disclosure, where a quick inspection on the quality of the solar cell would be objectively performed based on a IV curve measured from the solar cell as well as quantification values. With no restriction on either weather or locations, any defect in the solar cell would be identified ahead of time for early exchange so as to ensure the usage safety as well as minimize fire hazards at power stations.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A defect inspection method for a solar cell, applicable to a defect inspection system having a measuring device, a processing device, and an output device, wherein the processing device is connected to the measuring device and the output device, and wherein the method comprises:
    measuring a plurality of output voltages and a plurality of output currents of the solar cell by the measuring device;
    generating a stepwise current-voltage curve (stepwise IV curve) and a fitted current-voltage curve (fitted IV curve) by the processing device according to the output voltages and the output currents, wherein the stepwise IV curve comprises a plurality of steps, wherein the fitted IV curve corresponds to an ideal current-voltage curve when the solar cell has no defect;
    determining whether a first error of the fitted IV curve is less than a first error tolerance by the processing device;
    when the first error is not less than the first error tolerance, determining whether there exists at least one surge in each of the steps of the stepwise IV curve by the processing device so as to accordingly determine whether the solar cell has a defect; and
    outputting a determined result of the processing device by the output device.

2. The method according to claim 1, wherein the defect is a formation of hot spots.

3. The method according to claim 1, wherein the step of measuring the output voltages and the output currents of the solar cell by the measuring device comprises:
    performing inspection on the solar cell in a current-voltage stepwise scanning mode and measuring a plurality of voltages and a plurality of currents outputted by the solar cell by the measuring device.

4. The method according to claim 3, wherein the step of generating the stepwise IV curve and the fitted IV curve by the processing device according to the output voltages and the output currents comprises:
   generating the step IV curve by the processing device based on a correspondence between the output voltages and the output currents; and
   performing curve fitting on a representative IV point of each of the steps in the step IV curve by the processing device to generate the fitted IV curve.

5. The method according to claim 1 further comprising:
   when the first error is less than the first error tolerance, determining that the solar cell does not have the defect by the processing device.

6. The method according to claim 1, wherein when the first error is not less than the first error tolerance, the step of determining whether there exists the at least one surge in each of the steps of the stepwise IV curve by the processing device comprises:
   determining whether there exists the at least one surge in each of the steps by using a peak function by the processing device.

7. The method according to claim 6, wherein the peak function is a linear combination of a Gaussian function and a Lorentzian function.

8. The method according to claim 1, wherein the step of determining whether there exists the at least one surge in each of the steps of the stepwise IV curve by the processing device so as to accordingly determine whether the solar cell has the defect comprises:
   obtaining a centralized point corresponding to each of the at least one surge by the processing device;
   calculating an average of a set value corresponding to each of the centralized point by the processing device to generate a set average; and
   calculating a second error of the set average and each of the centralized point by the processing device to accordingly determine whether the solar cell has the defect.

9. The method according to claim 8, wherein the step of calculating the second error of the set average and each of the centralized point by the processing device to accordingly determine whether the solar cell has the defect comprises:
   when the second error is less than a second error tolerance, determining that the solar cell does not have the defect by the processing device.

10. The method according to claim 8, wherein the step of calculating the second error of the set average and each of the centralized point by the processing device to accordingly determine whether the solar cell has the defect comprises:
    when the second error is not less than the second error tolerance, determining an extreme slope of a parameter extreme by the processing device according to the step IV curve;
    determining whether the fitted curve corresponds to an ideal slope of the parameter extreme by the processing device;
    determining whether a third error between the extreme slope and the ideal slope is less than a third error tolerance by the processing device to accordingly determine whether the solar cell has the defect.

11. The method according to claim 10, wherein the parameter extreme is one of an open circuit voltage, a short circuit current, and a maximum power.

12. The method according to claim 10, wherein the step of determining whether the third error between the extreme slope and the ideal slope is less than the third error tolerance by the processing device to accordingly determine whether the solar cell has the defect comprises:
    when the third error is less than the third error tolerance, determining that the solar cell does not have the defect by the processing device.

13. The method according to claim 10, wherein the step of determining whether the third error between the extreme slope and the ideal slope is less than the third error tolerance by the processing device to accordingly determine whether the solar cell has the defect comprises:
    when the third error is not less than the third error tolerance, determining whether a fourth error between the extreme slope and the ideal slope is greater than a fourth error tolerance by the processing device so as to accordingly determine whether the solar cell has the defect, wherein the fourth error tolerance is greater than the third error tolerance.

14. The method according to claim 13, wherein the step of determine whether the fourth error between the extreme slope and the ideal slope is greater than the fourth error tolerance by the processing device so as to accordingly determine whether the solar cell has the defect comprises:
    when the fourth error is greater than the fourth error tolerance, determining that the solar cell has the defect by the processing device; and
    when the fourth error is not greater than the fourth error tolerance, determining that the solar cell has another defect different from the defect by the processing device.

15. The method according to claim 1, wherein the step of outputting the determined result of the processing device by the output device further comprises:
    when the solar cell is determined to have the defect, outputting an alert signal by the output device.

16. The method according to claim 1, wherein the step of outputting the determined result of the processing device by the output device further comprises:
    when the solar cell is determined to have the defect, sending the determined result to another electronic device by the output device.

17. A defect inspection system for a solar cell comprising:
    a measuring device, configured to measure a plurality of output voltages and a plurality of output currents of the solar cell;
    a processing device, connected to the measuring device, and configured to generate a stepwise current-voltage curve (stepwise IV curve) and a fitted current-voltage curve (fitted IV curve) according to the output voltages and the output currents, determine whether a first error of the fitted IV curve is less than a first error tolerance, determine whether there exists at least one surge in each of the steps of the stepwise IV curve when the first error is not less than the first error tolerance so as to accordingly determine whether the solar cell has a defect, wherein the stepwise IV curve comprises a plurality of steps, and wherein the fitted IV curve corresponds to an ideal current-voltage curve when the solar cell does not have any defect; and
    an output device, connected to the processing device, and configured to output a determined result of the processing device.

18. The system of claim 17, wherein the defect is a formation of hot spots.

19. The system of claim 17, wherein the measuring device performs inspection on the solar cell in a current-voltage stepwise scanning mode and measures a plurality of voltages and a plurality of currents outputted by the solar cell.

20. The system of claim 17, wherein the output device outputs a warning signal or sends the determined result to another electronic device when the solar cell has the defect.

* * * * *